United States Patent [19]

Adams

[11] Patent Number: 4,628,461
[45] Date of Patent: Dec. 9, 1986

[54] PHASE DETECTOR

[75] Inventor: Neil R. Adams, San Francisco, Calif.

[73] Assignee: Advanced Micro Devices, Inc., Sunnyvale, Calif.

[21] Appl. No.: 605,320

[22] Filed: Apr. 30, 1984

[51] Int. Cl.[4] .......................... H03L 7/08; H03K 1/17
[52] U.S. Cl. .................................. 364/481; 331/1 A; 375/120
[58] Field of Search ............... 364/481; 375/119, 120, 375/81; 360/51, 43, 41; 331/1 A

[56] References Cited

U.S. PATENT DOCUMENTS

| 4,143,407 | 3/1979 | Liberty | 360/51 |
| 4,363,003 | 12/1982 | Osaka et al. | 331/1 A |
| 4,376,958 | 3/1983 | Pettigrew | 360/51 X |
| 4,380,815 | 4/1983 | Clendening | 375/120 X |
| 4,390,910 | 6/1983 | Wilson | 360/51 X |
| 4,424,497 | 1/1984 | Fellinger | 331/1 A |
| 4,510,462 | 4/1985 | Edwards et al. | 331/1 A |
| 4,534,044 | 8/1985 | Funke et al. | 375/120 |
| 4,542,351 | 9/1985 | Okada | 375/120 X |
| 4,549,148 | 10/1985 | Hoefman | 331/1 A |

Primary Examiner—Edward J. Wise
Attorney, Agent, or Firm—Patrick T. King; Martin C. Fliesler; J. Vincent Tortolano

[57] ABSTRACT

A phase detector for detecting in real time the difference in phase between frequency pulse signals and data pulse signals, including a control signal generator for generating control signals corresponding to the occurrence of the frequency pulse signals and the occurrence or non-occurrence of the data pulse signals, and a circuit, operative during the occurrence or non-occurrence of the data pulse signals, for producing a phase error signal indicating differences between the real time occurrence of the frequency pulse signals and the data pulse signals. Another circuit of the phase detector, if needed, responds to the control signals to correct the integral of the phase error signal.

19 Claims, 5 Drawing Figures

PHASE DETECTOR

BACKGROUND OF THE INVENTION

1. Technical Field

The present invention relates generally to apparatus for comparing two signals and, more particularly, to a phase detector for detecting the difference in phase between frequency pulse signals and data pulse signals.

2. Background Art

In the processing of information generally, it often is necessary to compare two different signals to accomplish a variety of purposes. The comparison may result in the generation of an error signal representing a difference between the two signals. Circuitry may then respond to the error signal to minimize this difference between the two signals or perform some other function based on this difference, as is needed.

For example, a phase detector is conventionally used to detect the difference in phase between two signals. The phase detector may be used in a phase-locked loop that, among other components, has a voltage controlled oscillator (VCO) whose output is a frequency pulse signal. The phase detector receives a stream of data pulse signals, together with the frequency pulse signal which is fed back from the VCO. Any difference in phase between the data pulse signals and the frequency pulse signal results in the generation of a phase error signal that is filtered and then used to control the VCO so that the frequency pulse signal and the data pulse signals become in phase.

Certain types of data pulse streams, such as those known as MFM disk data, can cause difficulty when inputted to a phase-locked loop via the phase detector. This is because the data pulse stream will have "holes" in it, meaning that there are no data pulse signals in the pulse stream for a given period, such as a "bit time" if the data pulse signals are binary digital signals. As is known, these "missing" data pulse signals can cause the phase detector to malfunction.

A prior approach to solving the problem of the missing data pulse signals is to arm the phase detector only if a data pulse signal occurs and to disarm the phase detector if a data pulse signal does not occur during the bit time. This technique uses a time delay device which receives in real time the stream of data pulse signals and outputs to the phase detector delayed data pulse signals which are to be compared to the frequency pulse signal of the VCO. The phase detector also receives in real time the stream of data pulse signals for arming purposes.

Thus, in operation, the data pulse stream is fed to the input of the time delay device as well as to the phase detector. If a data pulse signal occurs, the phase detector is armed and then, a short time later, receives the same, but delayed, data pulse signal which had been delayed by the time delay device. This delayed data pulse signal is then compared with the frequency pulse signal to produce the phase error signal. However, if no data pulse signal occurs during the bit time, the phase detector is not armed, so that it does not operate for phase detection purposes.

One problem with the prior solution is the requirement of a time delay device. In addition to requiring a time delay device which may be expensive, the delay must be precise, so as to have the phase detector properly compare its two input signals. The realization of such a precision time delay is not always easily accomplished. Also, the delay should be equal to one-half the cycle of the nominal frequency of the VCO. Therefore, if the nominal frequency of the VCO is to be changed, which may require using a different VCO in the phase-locked loop, then a new time delay device may be needed in view of the requirement that the delay be equal to one-half the cycle of the nominal frequency. Still furthermore, the arming and disarming of the phase detector has the disadvantage of causing the phase detector to change state between an operative or armed condition and a non-operative or disarmed condition.

SUMMARY OF THE INVENTION

The present invention is an apparatus for comparing in real time first signals and second signals, including means for generating control signals corresponding to the occurrence of the first signals and the occurrence or non-occurrence of the second signals, and means, responsive to said control signals, for producing an output signal indicating differences between the real time occurrence of the first signals and the second signals, the producing means being operative during the occurrence or non-occurrence of the second signals.

The present invention, by making the comparison of the first and second signals in real time, does not require the use of any time delay device. Furthermore, the present invention operates during the occurrence or non-occurrence of the second signals, thereby not requiring any arming mechanism which would switch the apparatus between operative and non-operative states.

BEST MODE OF CARRYING OUT THE INVENTION

Figure 1:
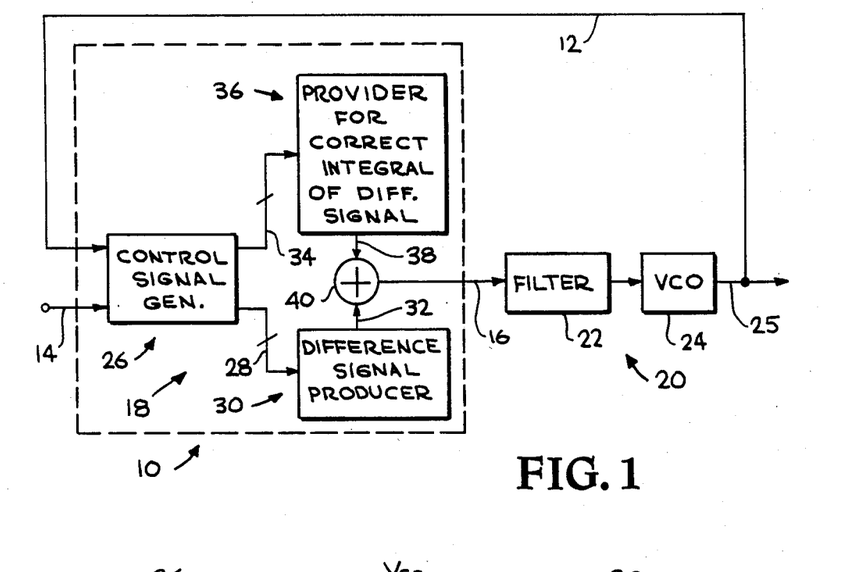
FIG. 1 is a block diagram of a phase-locked loop showing one application of the present invention.

FIG. 1 shows a circuit 10 of the present invention for comparing in real time input signals received on a line 12 and a line 14, respectively. In response to these input signals, the circuitry 10 produces an error signal on an output line 16 indicating a difference between the two input signals. As one example, the circuitry 10 is a phase comparator or detector 18 which may be part of an overall phase-locked loop 20 that also has a filter 22 and a voltage controlled oscillator (VCO) 24.

In the general operation of the phase-locked loop 20, the VCO 24 will output on a line 25 frequency pulse signals that are fed back over line 12 as one of the input signals to the phase comparator 18. The other input signals on line 14 may be a stream of externally supplied data pulse signals which are to be compared to the frequency pulse signals on line 12. In response to any phase difference between the frequency pulse signals on line 12 and the data pulse signals on line 14, the phase comparator 18 will output a phase error signal on line 16. The filter 22 then filters the phase error signal which then controls the VCO 24 to adjust the frequency of the frequency pulse signals on line 25 in a direction to be in phase with the data pulse signals on line 14 and, thereby, minimize the phase error signal on line 16.

The phase-locked loop 20 operates in such a manner that the frequency pulse signals on line 12 always occur, i.e., are always present, as an input to the phase detector 18. However, the externally provided data pulse signals on line 14 may or may not occur during a cycle of the frequency pulse signals on line 12 for any number of well-known reasons. Nevertheless, the phase detector 18 is always operative to provide an accurate phase error signal on line 16, irrespective of the occurrence or non-occurrence of the data pulse signals on line 14. As will be further described, the phase detector 18 assumes that a data pulse signal will occur during a given cycle of the frequency pulse signals, and corrects for that assumption should the data pulse signal not occur.

The phase detector 18 has means 26 for generating control signals on lines 28 indicating the occurrence of the frequency pulse signals on lines 12 and the occurrence or non-occurrence of the data pulse signals on line 14. The phase detector 18 also has a means 30, responsive to the control signals on lines 28, for producing an output signal on a line 32 which indicates the phase difference between the real time occurrence of the frequency pulse signals on line 12 and the data pulse signals on line 14.

As will be further described, the phase error signal produced by the means 30 on line 32 will be at a correct level at the end of each respective cycle of the frequency pulse signals on line 12. However, in certain applications of the phase detector 18, such as for a phase-locked loop 20, not only should the level of the phase error signal be correct at the end of each cycle, but the integral of the phase error signal throughout the duration of each cycle should be correct for satisfactory operation of the overall phase-locked loop 20. The means 30 may not provide for the proper integral of the phase error signal throughout each cycle. Accordingly, if it is needed or otherwise advantageous for the operation of a given phase-locked loop 20, the means 26 also can be adapted to produce control signals on lines 34 which indicate the occurrence of the frequency pulse signals on line 12 and the occurrence or non-occurrence of the data pulse signals on line 14. The phase detector 18 then will also have means 36 for providing for the correct integral of the phase error signal throughout the duration of each cycle by outputting a signal on a line 38 which, when summed with the signal on line 32 by a summer 40, results not only in the correct phase error signal on line 16 at the end of each cycle, but the correct integral of the phase error signal on line 16 during each cycle.

Figure 2:
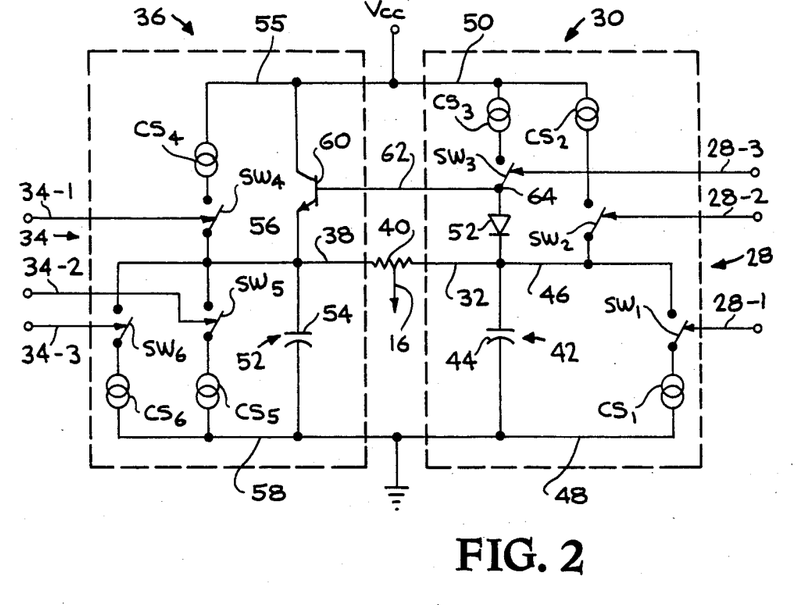
FIG. 2 is a schematic illustration of partial circuitry of a phase detector of the present invention.
Figure 3:
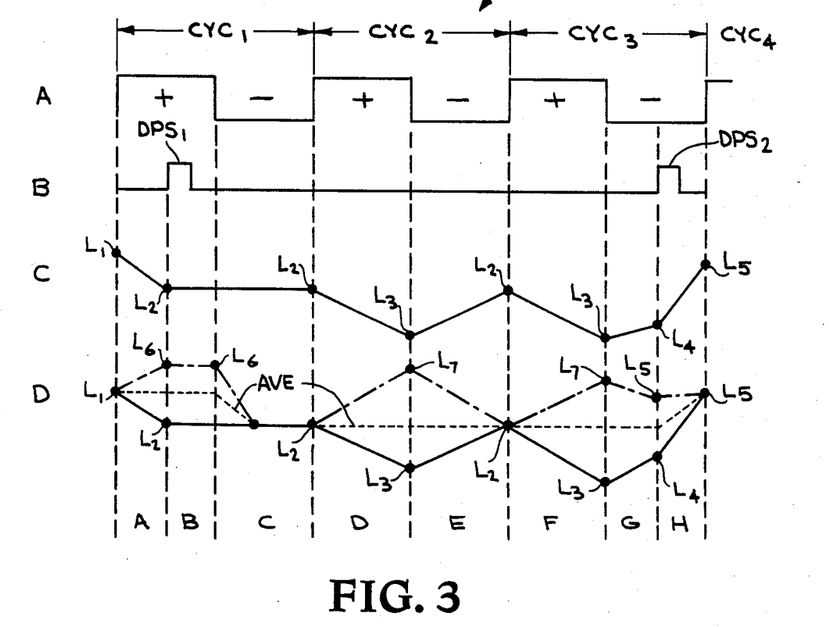
FIGS. 3A–3D are waveforms used to explain the present invention.
Figure 4:
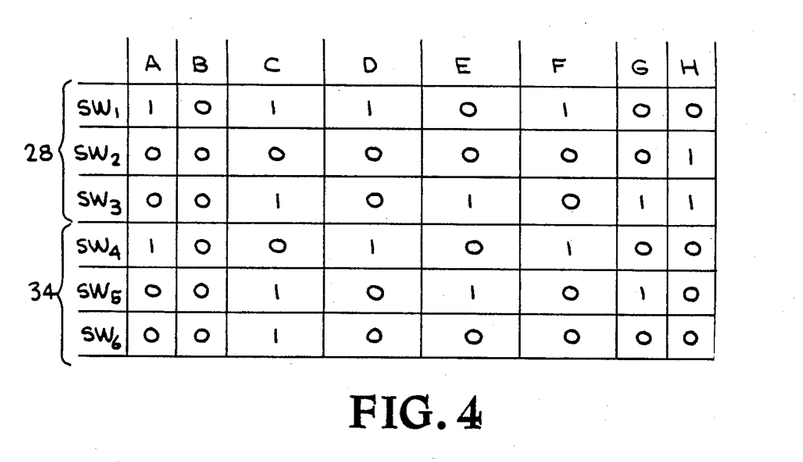
FIG. 4 is a truth table used to explain one mode of operation of the present invention.

FIG. 2 illustrates schematically the means 30 which responds to the control signals on lines 28 to produce the output signal on line 32 leading to the summer 40. FIG. 3A shows the frequency pulse signals on line 12, FIG. 3B shows the occurrence and non-occurrence of the data pulse signals on line 14, and FIG. 3C shows the output signal on line 32. FIG. 4 is a truth table of the logic or control signals on the lines 28 for the specific waveform periods A–H that are shown.

The means 30 has a charge storage device 42, such as a capacitor 44, for storing a charge representing the difference in phase between the frequency pulse signals on line 12 and the data pulse signals on line 14. A current source $CS_1$, supplying a current of magnitude I, is coupled to the capacitor 44 through a switch $SW_1$ and a line 46. When switch $SW_1$ is closed, the capacitor 44 is discharged via line 46, switch $SW_1$, current source $CS_1$ and a line 48 to ground. When switch $SW_1$ is open, the capacitor 44 is not discharged.

Another current source $CS_2$, coupled to $V_{CC}$ over a line 50, supplies a current of magnitude I to the capacitor 44 via a switch $SW_2$ and the line 46. Thus, when the switch $SW_2$ is closed, the current source $CS_2$ supplies current of magnitude I to charge the capacitor 44. When switch $SW_2$ is open, the capacitor 44 is not charged by the current source $CS_2$.

Another current source $CS_3$, coupled to line 50, supplies current of a magnitude I to the capacitor 44 via a switch $SW_3$, a diode 52 and line 46. When switch $SW_3$ is closed, the capacitor 44 is charged by current source $CS_3$ through switch $SW_3$, diode 52 and line 46. When switch $SW_3$ is open, the capacitor 44 is not charged by the current source $CS_3$.

The respective switches $SW_1$, $SW_2$, and $SW_3$ are controlled by respective logic control signals on respective lines 28-1, 28-2 and 28-3 of the lines shown generally at 28. FIG. 4 shows the logic state of these control signals on respective lines 28-1 to 28-3 for respective waveform periods A–H. A logic 1 indicates that the corresponding switch is closed and a logic 0 indicates that the switch is open.

As shown in FIG. 3A, the frequency pulse signal on line 12 has given cycles CYC, with three exemplary cycles $CYC_1$–$CYC_3$ being shown. Each cycle $CYC_1$–$CYC_3$ has a positive half cycle and a negative half cycle. As indicated in FIG. 3B, three conditions will be described in which (1) a data pulse signal $DPS_1$ on line 14 occurs during the positive half cycle of a given cycle CYC, such as cycle $CYC_1$, (2) no data pulse signal on line 14 occurs during a full cycle, such as $CYC_2$, and (3) a data pulse signal $DPS_2$ on line 14 occurs during the negative half cycle of a given cycle CYC, such as cycle $CYC_3$. As will be further described, the phase detector 18 operates continuously by assuming that a data pulse signal will arrive on line 14 during a given cycle CYC of the frequency pulse signal on line 12. If the data pulse signal on line 14 does in fact arrive, then the assumption is correct. If the assumption is incorrect, in that such a data pulse signal does not arrive on line 14 during a given cycle CYC, then the phase detector 18 undertakes corrective action during the course of the given cycle CYC.

The operation of the means 30 will be described in relation to the waveform periods A–H shown in FIGS. 3A–3D. Also, it will be assumed that at the leading edge of the positive half cycle of $CYC_1$, the capacitor 44 is charged to a level $L_1$, as shown in FIG. 3C. As shown in FIG. 4, when such a leading edge occurs on line 12, switch $SW_1$ is closed, and switch $SW_2$ and switch $SW_3$ are opened, with these switches $SW_1$–$SW_3$ remaining in these states during the waveform period A. Accordingly, capacitor 44 begins to be discharged from the level $L_1$. Then, when the data pulse signal $DPS_1$ on line 14 occurs, which begins the waveform period B, switch $SW_1$ is opened and switches $SW_2$–$SW_3$ remain open, as indicated in FIG. 4. As a result, at this time the capacitor 44 has been discharged to a level $L_2$, as shown in FIG. 3C, and remains at this level $L_2$ through the waveform period C until the end of the cycle $CYC_1$. Thus, the level $L_2$ represents the difference in phase between the leading edge of the frequency pulse signal of cycle $CYC_1$ and the leading edge of the data pulse signal DPS$_1$ occurring within the positive half cycle of this cycle CYC$_1$.

During the waveform period C, switch SW$_1$ and switch SW$_3$ are closed. Thus, current source CS$_1$ of magnitude I discharges the capacitor 44 while current source CS$_3$ of magnitude I charges the capacitor 44, so that the charge on capacitor 44 remains fixed, as shown. The reason for this dual discharging and charging of capacitor 44 will be discussed more fully below in relation to means 36.

Next, assume that cycle CYC$_2$ is occurring. At the leading edge of the positive half cycle of cycle CYC$_2$, which begins the waveform period D, switch SW$_1$ is closed, while switch SW$_2$ and switch SW$_3$ are opened. Accordingly, capacitor 44 is discharged through switch SW$_1$, beginning at level L$_2$ and until the end of the positive half cycle of cycle CYC$_2$ at which time the charge is at a level L$_3$. Then, since no data pulse signal has occurred during the positive half cycle of cycle CYC$_2$, at the commencement of the negative half cycle, which begins the waveform period E, the truth table of FIG. 4 shows that switch SW$_1$ is opened, switch SW$_2$ remains open and switch SW$_3$ is now closed. Accordingly, capacitor 44 is now charged by current source CS$_3$ through switch SW$_3$ from level L$_3$ back to level L$_2$. Thus, at the end of the cycle CYC$_2$, in which no data pulse signal has occurred, the charge on capacitor 44 is the same at the beginning and end of the cycle CYC$_2$.

Next, for cycle CYC$_3$, at the leading edge of the positive half cycle which starts waveform period F, and with capacitor 44 charged to level L$_2$, switch SW$_1$ becomes closed, switch SW$_2$ remains open and switch SW$_3$ becomes open, as indicated in FIG. 4. Accordingly, capacitor 44 now is discharged through switch SW$_1$ until the end of the positive half cycle to the level L$_3$. Then, at the commencement of the negative half cycle of the cycle CYC$_3$, beginning at waveform period G, switch SW$_1$ becomes open, switch SW$_2$ remains open, and switch SW$_3$ becomes closed. Accordingly, capacitor 44 is charged by current source CS$_3$ through switch SW$_3$ and diode 52 until the data pulse signal DPS$_2$ occurs during the negative half signal, at which time the charge is at a level L$_4$. Then, upon the occurrence of the leading edge of the data pulse signal DPS$_2$ during the negative half cycle, which commences waveform period H, and as indicated in FIG. 4, switch SW$_1$ remains open, but switch SW$_2$ now is closed with switch SW$_3$ remaining closed. Accordingly, capacitor 44 is now charged at a faster rate (2I) during waveform period H than during waveform period G, since current source CS$_2$ and current source CS$_3$ both supply current to capacitor 44. This charging at the rate of 2I occurs in anticipation of and until the leading edge of the next succeeding cycle CYC$_4$ occurs (only partially shown in FIG. 3A) at which time capacitor is charged to a level L$_5$, which is higher than level L$_4$ at the commencement of cycle CYC$_3$. This level L$_5$ indicates the difference in phase between the leading edge of the data pulse signal DPS$_2$ and the leading edge of the next succeeding cycle CYC$_4$.

As described above, the charge stored on the capacitor 44 at the end of each cycle CYC$_1$-CYC$_3$ provides the correct information on line 32 identifying the difference in phase between the data pulse signals on line 14 and the frequency pulse signals on line 12. However, while not specifically illustrated, it can be seen that the integral of the signal shown in FIG. 3C throughout the duration of each cycle CYC$_1$-CYC$_3$ may not be correct for the satisfactory operation of the phase-locked loop 20. Accordingly, the phase detector 18 also includes, as shown in FIG. 2, the means 36 for providing for a correct integral of the phase error signal by outputting a signal on line 38 which, when summed by summer 40, produces the desired correction.

The means 36 includes a charge storage device 52, such as a capacitor 54 which may be charged, discharged or have its charge fixed during the course of a given cycle CYC$_1$-CYC$_3$. A current source CS$_4$, coupled to V$_{cc}$ via a line 55, supplies a current of magnitude I through a switch SW$_4$ and a line 56 to charge the capacitor 54. A current source CS$_5$ of a magnitude I is coupled to the capacitor 54 through a switch SW$_5$ and line 56 to discharge the capacitor 54 to ground via a line 58. Another current source CS$_6$ is coupled to capacitor 54 through a switch SW$_6$ to discharge the capacitor 54 to ground via the line 58. Whereas the value of the current sources CS$_4$-CS$_5$ have the same magnitude I, the current source CS$_6$, for reasons to be described below, has a magnitude of I$_1$ which is greater than I, where I$_1$ may be, for example, 1.2I.

For reasons also to be described below, means 36 has a clamping transistor 60 having a collector coupled to line 55 and an emitter coupled to line 56, with its base being coupled over a line 62 to a node 64 between switch SW$_3$ and diode 52.

Switch SW$_4$, switch SW$_5$ and switch SW$_6$ are opened and closed in response to the logic control signals on respective lines 34-1 to 34-3, as shown in FIG. 2 and in accordance with the truth table of FIG. 4.

FIG. 3D shows in solid lines the same waveform of FIG. 3C produced by the means 30 on line 32. Also shown in FIG. 3D by the chain-dotted line, is the waveform produced by the means 36 on line 38.

In operation, upon the occurrence of the positive half cycle of cycle CYC$_1$ at the beginning of waveform period A, and assuming the charge on capacitor 54 is at level L$_1$ equal to the charge on capacitor 44, switch SW$_4$ is closed and switch SW$_5$ and switch SW$_6$ are open, as shown in FIG. 4. Accordingly, current source CS$_4$ begins to charge capacitor 54 through switch SW$_4$ and line 56 equally and opposite to the discharging of capacitor 44. Then, when the data pulse signal DPS$_1$ arrives during the positive half cycle of cycle CYC$_1$, shown at the beginning of the waveform period B, the switch SW$_4$ is now opened, with switch SW$_5$ and switch SW$_6$ remaining open. Accordingly, the charge on capacitor 54 is now at a level L$_6$ and becomes fixed or remains at level L$_6$ for the duration of the positive half cycle of cycle CYC$_1$.

Then, at the commencement of the negative half cycle of cycle CYC$_1$, which starts waveform period C, switch SW$_4$ remains open, but switch SW$_5$ and switch SW$_6$ now are closed. Therefore, capacitor 54 now discharges quickly from level L$_6$ to the level L$_2$ at or before the end of the negative half cycle of cycle CYC$_1$.

In order to be sure that capacitor 54 is discharged to the same level L$_2$ of capacitor 44 at or before the end of the negative half cycle CYC$_1$, both switch SW$_5$ and switch SW$_6$ are closed, so that a discharge or pull-down current of I+1.2I=2.2I via current source CS$_5$ and current source CS$_6$, respectively, is used. Actually, the maximum pull-down current need be only 2I, but the magnitude 2.2I is utilized to ensure that level L$_2$ will be reached within the appropriate time.

Furthermore, the clamping transistor 60 is used to ensure that capacitor 54 is not discharged below the level $L_2$. During the waveform period C, switch $SW_3$ is closed, as previously described, so that transistor 60 is base biased via line 62 at a voltage which is slightly higher than the voltage of capacitor 44 due to a one voltage drop across diode 52. Then, until the charge on capacitor 54 falls to about level $L_2$, the voltage of capacitor 54 maintains transistor 60 off. Then, when capacitor 54 is discharged to about level $L_2$, the transistor 60 is turned on, so that current source $CS_5$ and current source $CS_6$ now draw current from $V_{cc}$ through transistor 60, rather than from capacitor 54.

Then, for a cycle such as cycle $CYC_2$ in which a data pulse signal on line 14 does not occur, at the leading edge of the positive half cycle of cycle $CYC_2$, which commences the waveform period D, switch $SW_4$ is closed, with switch $SW_5$ and switch $SW_6$ being opened. Therefore, capacitor 54 is charged by current source $CS_4$ through closed switch $SW_4$ to a level $L_7$. This charging of capacitor 54 is equal and opposite to the discharging of capacitor 44 to level $L_3$.

Next, during the negative half cycle of the cycle $CYC_2$, which commences the waveform period E, switch $SW_4$ is opened, switch $SW_5$ is closed and switch $SW_6$ remains open, so that capacitor 54 is discharged through switch $SW_5$ to the level $L_2$ which is the charge on capacitor 44 at this time. Thus, for a cycle such as cycle $CYC_2$ during which no data pulse signal occurs on line 14, capacitor 54 is charged and discharged equally and opposite to the discharging and charging, respectively, of capacitor 44.

For cycle $CYC_3$ with the data pulse signal $DPS_2$ occurring during the negative half cycle, at the leading edge of the positive half cycle, which commences the waveform period F, switch $SW_4$ is closed, switch $SW_5$ is opened and switch $SW_6$ remains opened. Accordingly, current source $CS_4$ charges capacitor 54 through switch $SW_4$, equally and opposite to the discharging of capacitor 44, to the level $L_7$ at the end of the positive half cycle. Next, commencing at the negative half cycle, which begins the waveform period G, switch $SW_4$ is opened, switch $SW_5$ is closed and switch $SW_6$ remains open. Therefore, capacitor 54 is discharged via switch $SW_5$ to the level $L_5$, at which time the data pulse signal $DPS_2$ on line 14 occurs. At the time of the leading edge of the data pulse signal $DPS_2$, which commences the waveform period H, switch $SW_4$-switch $SW_6$ are opened, so that the charge level $L_5$ remains fixed during the waveform period H and equal to the charge on capacitor 44 at the end of cycle $CYC_3$.

FIG. 3D also shows in dotted lines the averaged signal AVE on line 16 at any instant of time throughout the duration of each cycle $CYC_1$-$CYC_3$. This averaged signal AVE results from using the means 36 in addition to the means 30. As may be appreciated, the integral of the averaged signal AVE is such that the overall phase-locked loop 20 will operate more satisfactorily than if means 36 were not used.

Figure 5:
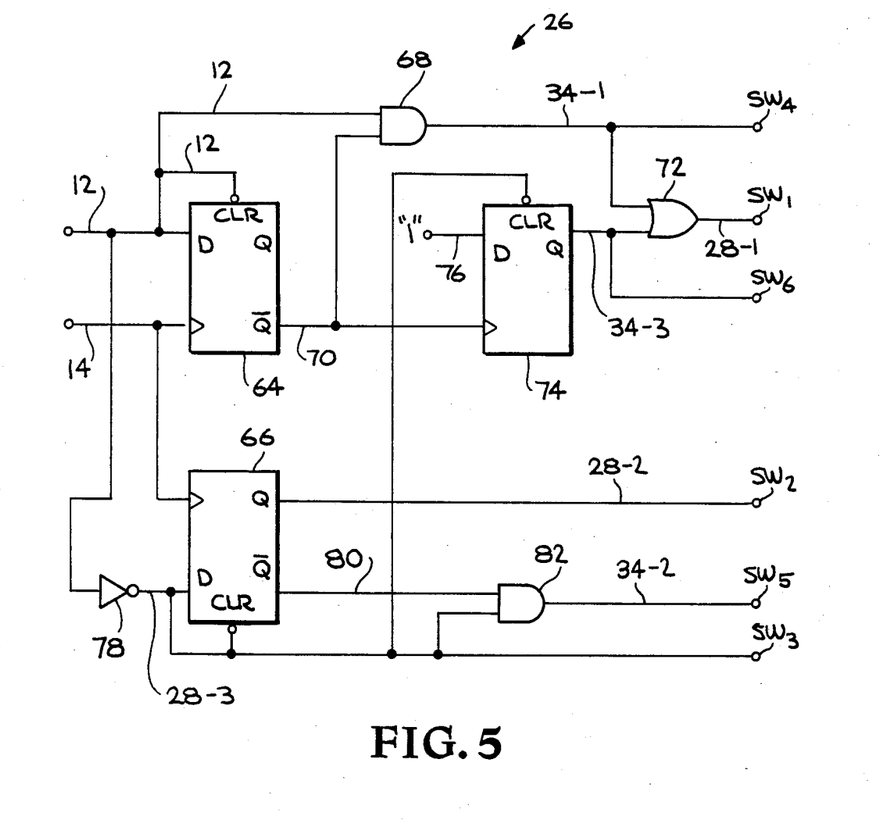
FIG. 5 illustrates schematically other circuitry of the present invention for implementing, as one example, the truth table of FIG. 4.

FIG. 5 shows schematically the means 26 for generating the control signals on lines 28-1 to 28-3 and lines 34-1 to lines 34-3 in response to the frequency pulse signals on line 12 and the data pulse signals on line 14. The means 26 includes a D-type flip-flop 64 which detects if data pulse signals on line 14 are occurring during any positive half cycle of the frequency pulse signals on line 12. Another flip-flop 66 detects if the data pulse signals on line 14 are occurring during any negative half cycle of the frequency pulse signals on line 12.

Accordingly, flip-flop 64 has a data input D coupled to line 12 and a clock input coupled to the line 14. Flip flop 64 also has a clear input coupled to line 12 for clearing the flip-flop 64 on negative going or trailing edges of the frequency pulse signals on line 12. An AND gate 68 has one input coupled to line 12 and another input coupled to the output $\overline{Q}$ of flip-flop 64 over a line 70. The output of gate 68 is produced on the line 34-1 which is coupled to the switch $SW_4$. An OR gate 72 has one input coupled to the output of gate 68 on line 34-1 and another input coupled to the output Q of a flip-flop 74 on the line 34-3 leading to switch $SW_6$. The output of OR gate 72 is coupled to line 28-1 leading to switch $SW_1$. Flip flop 74 has a D input receiving a logic 1 over a line 76 and a clock input coupled to the line 70.

An inverter 78 has its input coupled to line 12 and its output coupled to line 28-3 leading to switch $SW_3$ as well as to the D input of flip-flop 66 and to a clear input of flip-flop 74. The clock input of flip-flop 66 is coupled to the line 14, while the output Q of flip-flop 66 is coupled to the line 28-2 leading to switch $SW_2$ and the output $\overline{Q}$ is coupled to a line 80. An AND gate 82 has one input coupled to the line 28-3 and the other input coupled to line 80. The output of AND gate 82 is coupled to the line 34-2 leading to switch $SW_5$.

As previously mentioned, the control signal generating means 26 will produce logic control signals indicating at all times the occurrence of the frequency pulse signals on line 12 and the occurrence or non-occurrence of the data pulse signals on line 14. However, one sequence of operation of means 26 will now be described, assuming that the signals appear on line 12 and line 14 as shown in FIG. 3A-FIG. 3B, for each waveform period A-H. Thus, assume that flip-flop 64 is cleared and that flip-flop 66 is cleared. Then, at the leading edge of the positive half cycle of cycle $CYC_1$, line 12 is at logic 1 and flip-flop 64 has a logic 1 on line 70. Accordingly, AND gate 68 outputs on line 34-1 a logic 1 to close switch $SW_4$. In addition, with line 34-1 being a logic 1, the OR gate 72 outputs a logic 1 on line 28-1 to close switch $SW_1$. Furthermore, inverter 78 inverts the logic 1 on line 12 to produce a logic 0 on line 28-3, thereby clearing flip-flop 74 to produce a logic 0 on line 34-3 and open switch $SW_6$.

With flip-flop 66 being cleared at this time, the output Q on line 28-2 is at logic 0 to open switch $SW_2$. Also, since inverter 78 inverts the logic 1 on line 12 to produce the logic 0 on line 28-3, the switch $SW_3$ is opened. With line 28-3 being at logic 0 at this time, gate 82 is disabled to produce a logic 0 on line 34-2 to open switch $SW_5$. Thus, these are the logic states of switches $SW_1$-$SW_6$ as indicated for waveform period A in FIG. 4.

Then, at the beginning of the waveform period B, at the leading edge of the data pulse signal $DPS_1$, flip-flop 64 is clocked, as is flip-flop 66. Accordingly, the output Q on line 70 goes to logic 0, so that AND gate 68 is disabled to produce a logic 0 on line 34-1 and open switch $SW_4$. Also, flip-flip 74 remains in the same cleared state to continue producing a logic 0 on line 34-3. The two inputs to OR gate 72 are at logic 0, so that line 28-1 is now at logic 0. Flip-flop 66, while clocked, does not change state, so that line 28-2 and line 34-2 remain at logic 0, as does line 28-3. Thus, switches $SW_1$-$SW_6$ are in the open state shown in FIG. 4 for waveform B.

Next, at the beginning of waveform period C at the trailing edge of the positive half cycle of cycle $CYC_1$, flip-flop 64 is cleared via line 12. Accordingly, AND gate 68 outputs a logic 0 on line 34-1 in response to the logic 0 on line 12 and line 70 goes to logic 1 to clock flip-flop 74. Therefore, the output Q on line 34-3 is at logic 1, as is the output of OR gate 72 on line 28-1. Thus, switch $SW_1$ and switch $SW_6$ are closed, while switch $SW_4$ is open.

Since line 12 is at logic 0, line 28-3 is now at logic 1 during this waveform period C. Also, flip-flop 66 is still cleared to produce a logic 0 on line 28-2 and a logic 1 on line 80. Accordingly, AND gate 82 outputs a logic 1 from line 80 and a logic 1 from line 28-3 to produce a logic 1 on line 34-2. Therefore, switch $SW_2$ is open and switch $SW_3$ and switch $SW_5$ are closed, as indicated in FIG. 4.

Next, for waveform period D, at the leading edge of the positive half cycle of cycle $CYC_2$, line 12 goes to logic 1 with line 70 remaining at logic 1. Accordingly, AND gate 68 outputs a logic 1 on line 34-1. Also, OR gate 72 couples the logic 1 on line 34-1 to line 28-1. At this time, flip-flop 74 is cleared by the logic 0 on line 28-3, so that line 34-3 is at logic 0. Therefore, switch $SW_1$ and switch $SW_4$ are closed, while switch $SW_6$ is open.

At the leading edge of the positive half cycle of cycle $CYC_2$, flip-flop 66 is cleared via the logic 0 on line 28-3 at the output of inverter 78. Accordingly, line 34-2 leading to switch $SW_5$ is at logic 0 since AND gate 82 is disabled by the logic 0 on line 28-3. Also, with flip-flop 66 being cleared, the output Q on line 28-2 is at logic 0. Thus, switches $SW_2$, $SW_3$ and $SW_5$ are opened.

At the commencement of the waveform period E, flip-flop 64 becomes cleared and gate 68 becomes disabled. Accordingly, line 34-1 is at logic 0. Flip-flop 74 remains cleared to output a logic 0, so that line 28-1 is at logic 0 as is line 34-3. Thus, switches $SW_1$, $SW_4$ and $SW_6$ are opened.

Also, the output of inverter 78 at this time on line 28-3 is at logic 1. And with flip-flop 66 still being cleared, line 80 is at logic 1, resulting in line 34-2 being at logic 1 via AND gate 82, and line 28-2 is at logic 0. Thus, switch $SW_2$ is opened, while switches $SW_3$ and $SW_5$ are closed.

At the commencement of the waveform period F, line 12 goes to logic 1 and flip-flop 64 remains cleared, with line 70 at logic 1. Thus, gate 68 outputs a logic 1 on line 34-1, gate 72 outputs a logic 1 on line 28-1 and flip-flop 74, which is cleared via the logic 0 on line 28-3, provides a logic 0 on line 34-3. Therefore, switches $SW_1$ and $SW_4$ are closed, while switch $SW_6$ is opened.

Also, with line 28-3 going to logic 0, flip-flop 66 becomes cleared. Therefore, line 28-2 goes to logic 0 as does line 34-2. Thus, switches $SW_2$, $SW_3$ and $SW_5$ are opened.

Next, at the start of waveform period G, line 12 goes to logic 0 and flip-flop 64 is cleared. Thus, line 34-1 goes to logic 0, and with flip-flop 74 remaining cleared, line 34-3 is at logic 0, as is line 28-1. Therefore, switches $SW_1$, $SW_4$ and $SW_6$ are open.

Flip-flop 66 is still cleared at this time, with line 28-3 being at logic 1. Therefore, line 28-2 is at logic 0 and line 34-2 is at logic 1. Consequently, switches $SW_3$ and $SW_5$ are closed, while switch $SW_2$ is opened.

Finally, at the commencement of waveform period H, flip-flop 64 and flip-flop 66 are clocked by the data pulse signal $DPS_2$ on line 14 with line 12 being at logic 0. Accordingly, line 34-1, line 34-3 and line 28-1 are at logic 0, whereby switches $SW_1$, $SW_4$ and $SW_6$ are opened.

Line 28-3 is at logic 1 via inverter 78. Therefore, upon the clocking of flip-flop 66, line 28-2 goes to logic 1 and line 34-2 goes to logic 0 since gate 82 becomes disabled via the logic 0 on line 80. Thus, switches $SW_2$ and $SW_3$ are closed, while switch $SW_5$ is opened.

The foregoing description of preferred embodiments of the invention has been presented for purposes of illustration and description. It is not inended to be exhaustive or to limit the invention to the precise form described, and many modifications and variations are possible in light of the above teaching. The embodiments were chosen and described in order to best explain the principles of the invention and its practical application to thereby enable others skilled in the art to best utilize the invention in various embodiments and with various modification as are suited to the particular use contemplated. It is intended that the scope of the invention be defined by the claims appended hereto.

What is claimed:

1. Apparatus for comparing in real time first signals and second signals, comprising:
    (a) means for generating control signals corresponding to the occurrence of the first signals and the occurrence or non-occurrence of the second signals; and
    (b) means, responsive to said control signals, for producing an output signal indicating differences between the real time occurrence of the first signals and second signals, said means for producing being operative during the occurrence or non-occurrence of the second signals, said means for producing being operative during the non-occurrence of the second signals while producing no change in the output signal.

2. Apparatus, according to claim 1, wherein said means for producing an output signal is operative continuously.

3. Apparatus, according to claim 1, wherein the first signals have a certain cycle, and wherein said means for producing assumes that one of the second signals will occur during the certain cycle and corrects for the assumption in the event the one second signal does or does not occur during the certain cycle.

4. Apparatus, according to claim 3, wherein the certain cycle includes a positive half cycle and a negative half cycle, and wherein in the event the one second signal does not occur during the certain cycle, the correction occurs beginning at the negative half cycle.

5. Apparatus, according to claim 4, wherein said means for producing comprises a charge storage device, and wherein, in the event the one second signal does not occur during the certain cycle, said charge storage device is discharged during the positive half cycle and charged during the negative half cycle, so that the said charge storage device has the same charge at the beginning and end of the certain cycle.

6. Apparatus, according to claim 1, wherein the first signals have a certain cycle including a positive half cycle and a negative half cycle, wherein said means for producing comprises a charge storage device, and wherein said means for producing charges and discharges said charge storage device as follows:
    (a) in the event one of the second signals occurs during the positive half cycle, said charge storage device is discharged from the beginning of the positive half cycle until the occurrence of the one second signal and then retains the remaining charge until the end of the certain cycle, in which a difference in charge between the beginning and end of the certain cycle represents a difference in phase between the one second signal and the one first signals;

(b) in the event one of the second signals does not occur during the entire certain cycle, said charge storage device is discharged from the beginning of the positive half cycle until the beginning of the negative half cycle, and then said charge storage device is charged from the beginning of the negative half cycle until the end of the negative half cycle, in which there is no difference in charge on said charge storage device between the beginning and end of the certain cycle; and (c) in the event one of the second signals occurs during the negative half cycle, said charge storage device is discharged from the beginning of the positive half cycle until the beginning of the negative half cycle, then said charge storage device is charged at a first rate until the occurrence of the one second signal and then is charged at a second rate until the end of the negative half cycle, in which a difference in charge between the beginning and end of the certain cycle represents a difference in phase between the one second signal and the beginning of a next succeeding certain cycle of the first signals.

7. Apparatus, according to claim 1, wherein the first signals each have a certain cycle, wherein said output signal of said producing means has a correct value at the end of each cycle of the first signals and wherein the integral of the output signal during each cycle of the first signals may be incorrect for a given application of the apparatus.

8. Apparatus, according to claim 7, further comprising means for providing for the correction of the integral of the output signal.

9. A phase detector for detecting the difference in phase in real time between first signals and second signals, the first signals each having a certain cycle and the second signals occurring or not occurring during the certain cycle, (a) means for generating control signals in response to the occurrence of the first signals and the occurrence or non-occurrence of the second signals; and (b) means, responsive to the control signals, for producing a phase error signal identifying the difference in phase in real time between the first signals and the second signals, said means for producing operating continuously irrespective of the occurrence or non-occurrence of second signals, said means for producing being operative during the non-occurrence of the second signals while producing no change in the phase error signal.

10. A phase detector, according to claim 9, wherein said means for producing comprises:

(a) a first charge storage device storing a charge indicating any difference in phase between the first signals and the second signals; and (b) first means for charging, discharging and retaining the charge on said charge storage device in response to said control signals.

11. A phase detector, according to claim 10, wherein the certain cycle has a positive half cycle and a negative half cycle, and wherein said first means for charging, discharging and retaining the charge operates as follows:

(a) in the event one of the second signals occurs during the positive half cycle, said first charge storage device is discharged from the beginning of the positive half cycle until the occurrence of the one second signal and then retains the remaining charge until the end of the certain cycle, in which there is a difference in charge on said first charge storage device between the beginning and end of the certain cycle;

(b) in the event one of the second signals does not occur during the certain cycle, said first charge storage device is discharged from the beginning of the positive half cycle until the beginning of the negative half cycle, and then said first charge storage device is charged from the beginning of the negative half cycle until the end of the negative half cycle, in which there is no difference in charge on said first charge storage device between the beginning and end of the certain cycle; and (c) in the event one of the second signals occurs during the negative half cycle, said first charge storage device is discharged from the beginning of the positive half cycle until the beginning of the negative half cycle, then said first charge storage device is charged at a first rate until the occurrence of the one second signal and then is charged at a second rate until the end of the negative half cycle, in which there is a difference in charge on said first charge storage device between the beginning and end of the certain cycle.

12. A phase detector, according to claim 11, wherein said first charge storage device comprises a capacitor.

13. A phase detector, according to claim 12, wherein said first means for charging, discharging and retaining comprises:

(a) a plurality of current sources for supplying to and withdrawing current from said charge storage device; and (b) a plurality of switches, responsive to said control signals, for coupling and decoupling said plurality of current sources to and from said capacitor.

14. A phase detector, according to claim 11, wherein said phase error signal has a correct value at the end of each cycle of the first signals and wherein the integral of the phase error signal during each cycle of the first signals may be incorrect for a given application of the apparatus.

15. A phase detector, according to claim 4, further comprising means for providing for the correction of the integral of the output signal.

16. A phase detector, according to claim 15, wherein said means for providing comprises:

(a) a second charge storage device for storing charge; and (b) second means for charging, discharging and retaining the charge on said other charge storage device in response to said control signals.

17. A phase detector, according to claim 16, wherein said second means for charging, discharging and retaining the charge operates as follows:

(a) in the event one of the second signals occurs during the positive half cycle, said second charge storage device is charged from the beginning of the positive half cycle until the occurrence of the one second signal, then the increased charge is retained until the end of the positive half cycle and then said second charge storage device is discharged from the beginning of the negative half cycle until no later than the the end of the negative half cycle;

(b) in the event one of the second signals does not occur during the certain cycle, said second charge storage device is charged from the beginning of the positive half cycle until the beginning of the negative half cycle, and then said second charge storage device is discharged from the beginning of the negative half cycle until the end of the negative half cycle; and (c) in the event one of the second signals occurs during the negative half cycle, said second charge storage device is charged from the beginning of the positive half cycle until the end of the positive half cycle, then discharged from the beginning of the negative half cycle until the occurrence of the one second signal and then the remaining charge is retained from the occurrence of the one signal until the end of the negative half cycle.

18. A phase detector, according to claim 17, wherein the charge on said second charge storage device is equal to the charge on said first storage device at the beginning of each certain cycle and at the end of each certain cycle.

19. An integrated circuit phase detector for detecting the difference in phase between continuously occurring frequency pulse signals having cycles of positive half cycles and negative half cycles, and data pulse signals which may or may not occur during the cycles, comprising:

(a) logic circuit means, responsive to the frequency pulse signals and the data pulse signals, for generating logic control signals indicating the real time occurrence of the frequency pulse signals and the occurrence or non-occurrence of the data pulse signals;

(b) a first capacitor;

(c) first current source means for charging, discharging and retaining the charge on said first capacitor in response to said logic control signals, wherein (i) in the event one of the data pulse signals occurs during the positive half cycle of one of the cycles, said first capacitor is discharged from the beginning of the positive half cycle of the one cycle until the occurrence of the one data pulse signal and then retains the remaining charge until the end of the one cycle, in which a difference in charge on said first capacitor between the beginning and end of the one cycle represents a difference in phase between the one data pulse signal and the frequency pulse signals, (ii) in the event one of the data pulse signals does not occur during an entire cycle, said first capacitor is discharged from the beginning of the positive half cycle until the beginning of the negative half cycle, and then said first capacitor is charged from the beginning of the negative half cycle until the end of the negative half cycle, in which there is no difference in charge on said first capacitor between the beginning and end of the cycle, and (iii) in the event one of the data pulse signals occurs during the negative half cycle, said first capacitor is discharged from the beginning of the positive half cycle until the beginning of the negative half cycle, then said first capacitor is charged at a first rate until the occurrence of the one data pulse signal and then is charged at a second rate until the end of the negative half cycle, in which a difference in charge between the beginning and end of the cycle represents a difference in phase between the one data pulse signal and the beginning of a next succeeding cycle of the frequency pulse signals; and (d) a second capacitor;

(e) second current source means for charging, discharging and retaining a charge on said second capacitor in response to said control signals, wherein (i) in the event one of the data pulse signals occurs during the positive half cycle of one of the cycles, said second capacitor is charged from the beginning of the positive half cycle until the occurrence of the one data pulse signal, then the increased charge is retained until the end of the positive half cycle and then said second capacitor is discharged from the beginning of the negative half cycle until no later than the end of the negative half cycle, (ii) in the event one of the data pulse signals does not occur during one of the cycles, said second capacitor is charged from the beginning of the positive half cycle until the beginning of the negative half cycle, and then said second capacitor is discharged from the beginning of the negative half cycle until the end of the negative half cycle, (iii) in the event one of the data pulse signals occurs during the negative half cycle, said second capacitor is charged from the beginning of the positive half cycle until the end of the positive half cycle, then discharged from the beginning of the negative half cycle until the occurrence of the one data pulse signal and then said second capacitor retains the remaining charge from the occurrence of the one data pulse signal until the end of the negative half cycle; and (f) means for summing the charge on said first capacitor and said second capacitor to produce a phase error signal indicating the difference in phase between the frequency pulse signals and the data pulse signals.

* * * * *